US009759796B2

(12) United States Patent
Hwang (10) Patent No.: US 9,759,796 B2
(45) Date of Patent: Sep. 12, 2017

(54) METHOD AND APPARATUS FOR ELIMINATING NOISE IN MAGNETIC RESONANCE IMAGES

(71) Applicant: INDUSTRY-ACADEMIC COOPERATION FOUNDATION, YONSEI UNIVERSITY, Seoul (KR)

(72) Inventor: Dosik Hwang, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 661 days.

(21) Appl. No.: 14/158,030

(22) Filed: Jan. 17, 2014

(65) Prior Publication Data

US 2014/0203808 A1    Jul. 24, 2014

(30) Foreign Application Priority Data

Jan. 18, 2013    (KR) .......................... 10-2013-0005824

(51) Int. Cl.
    *G01V 3/00*     (2006.01)
    *G01R 33/565*   (2006.01)
    (Continued)

(52) U.S. Cl.
    CPC ............ *G01R 33/565* (2013.01); *G06T 5/002* (2013.01); *G06T 5/50* (2013.01); *G06T 2207/10088* (2013.01); *G06T 2207/30004* (2013.01)

(58) Field of Classification Search
    USPC ........................................................ 324/318
    See application file for complete search history.

(56) References Cited

U.S. PATENT DOCUMENTS 6,674,880 B1 *   1/2004   Stork ................... G06T 7/0012
                                                     382/128
8,699,769 B2 *   4/2014   Schoenmeyer ....... G06T 7/0012
                                                     382/128
(Continued)

FOREIGN PATENT DOCUMENTS

JP        2009-072570 A       4/2009
JP        2010-104614 A       5/2010

OTHER PUBLICATIONS

European Search Report dated Sep. 4, 2014 in connection with European Application No. 14151605.4.
(Continued)

*Primary Examiner* — Rodney Fuller
(74) *Attorney, Agent, or Firm* — Mintz Levin Cohn Ferris Glovsky and Popeo, P.C.; Kongsik Kim; Jonathon Western (57) ABSTRACT

A method and an apparatus for eliminating noise in magnetic resonance images are disclosed. An aspect of the invention provides a method for eliminating noise in a magnetic resonance image that includes: obtaining a multiple number of magnetic resonance images sequentially within a preset time range for the same part; calculating probability information, which relates to the probability of a first pixel and a second pixel of the multiple magnetic resonance images belonging to the same tissue, by using decay information, which relates to a decay in signal intensity values for the first pixel and the second pixel according to time; and determining a new signal intensity value for the first pixel and the second pixel based on a weighted average of signal intensity values of the first pixel and the second pixel according to the probability information.

4 Claims, 8 Drawing Sheets (51) Int. Cl.
  *G06T 5/00* (2006.01)
  *G06T 5/50* (2006.01)

(56) References Cited

U.S. PATENT DOCUMENTS

| | | | |
|---|---|---|---|
| 2004/0066978 A1* | 4/2004 | Nanbu | G06T 5/20 382/261 |
| 2005/0207631 A1* | 9/2005 | Martens | G06T 7/0012 382/131 |
| 2016/0131730 A1* | 5/2016 | Isogawa | G01R 33/565 324/309 |

OTHER PUBLICATIONS

Myoung Nyoun Kim et al., "Improved conductivity reconstruction from multi-echo MREIT utilizing weighted voxel-specific signal-to-noise ratios," Phys.Med.Biol. vol. 57, pp. 3643-3659, May 18, 2012.

A. Buades et al., "Image Denoising Methods. A New Nonlocal Principle," SIAM Review, vol. 52, No. 1, pp. 113-147, Jan. 1, 2010.

Oh In Kwon et al., "A tissue-relaxation-dependent neighboring method for robust mapping of the myelin water fraction," Neuroimage, vol. 74, pp. 12-21, Feb. 4, 2013.

P. Coupe et al., "An Optimized Blockwise Nonlocal Means Denoising Filter for 3-D Magnetic Resonance Images," IEEE Transactions on Medical Imaging, vol. 27, No. 4, pp. 425-441, Apr. 1, 2008.

\* cited by examiner

FIG. 1

Figure 1. T$_2^*$ Decay signals measured using multi-gradient-echo sequence

Comparison of denoised images of synthetic dataset at *TE*=55ms. True image (a), noisy image with SNR=40dB (b), And denoised images by LPF (c), MF (d), ADF (e), and the proposed method (f).

Images denoised by LPF with different kernel sizes, 5×5(a), 7×7 (b), and 11×11 (c) and images denoised by the proposed method with different kernel sizes 11×11 (d), 41×41(e), 61×61 (f).

FIG. 8

METHOD AND APPARATUS FOR ELIMINATING NOISE IN MAGNETIC RESONANCE IMAGES

CROSS-REFERENCE TO RELATED APPLICATIONS

This application claims the benefit of Korean Patent Application No. 10-2013-0005824 filed with on Jan. 18, 2013, the disclosure of which is incorporated herein by reference in its entirety.

TECHNICAL FIELD

The present invention relates to a method and an apparatus for eliminating noise in magnetic resonance images, more particularly to a method and an apparatus for eliminating noise in magnetic resonance images that can reduce the feel of artificiality while providing clear boundaries in the magnetic resonance images.

RELATED ART

A magnetic resonance image (MRI) is obtained by having a human body enter an apparatus that is equipped with a large magnet for generating a magnetic field, generating high-frequency waves to cause resonation in the hydrogen nuclei present in a body part, measuring the different signals released from the various tissues, and using a computer to reconstruct an image.

That is, when the apparatus equipped with a magnet emits high-frequency waves to the human body, the body may emanate echo signals, which are received, converted into digital information, and reconstructed into an image.

Unlike simple X-ray photography or CT scans, which are test methods that use X-ray radiation, magnetic resonance imaging is a test method that uses high-frequency waves, which are a form of non-ionizing radiation, and is thus essentially harmless to the human body. Using a magnetic field and radio frequency waves (i.e. non-ionizing radiation), which are harmless to the human body, magnetic resonance imaging can provide better contrast in internal soft tissues even without a contrast agent, compared to a CT scan, and can provide information related to the biochemical properties of tissues containing hydrogen nuclei.

Magnetic resonance imaging is similar to the CT scan in that it provides a cross-section of the human body, but whereas a CT scan focuses mainly on horizontal cross-section images, showing a horizontal cross section of the human body, MRI can freely obtain images along horizontal directions, vertical directions, diagonal directions, etc., as desired, without requiring the patient to change positions.

Since a magnetic resonance image would be used by a doctor to diagnose the conditions of a patient, it is critical that noise be eliminated for improved image analysis and quantitative analysis.

A conventional method of removing noise in an image is low pass filtering (LPF).

Low pass filtering employs a filter that uses average values of surrounding pixels, and while it can be effective in cases where there are no correlations between adjacent pixels, it may result in blurring and may lower the resolution of an image.

To improve this, other filters have been developed, such as the median filter, the anisotropic diffusion filter, etc. Although these filters do improve performance in noise removal, the application of such non-linear filters may cause an image to look unnatural, and detailed features may be erased.

These methods of noise elimination may not be suitable for magnetic resonance imaging, which especially requires detailed image analysis for accurate diagnosis.

SUMMARY

To resolve the problems above in the related art, an aspect of the invention is to propose a method and an apparatus for eliminating noise in magnetic resonance images that can provide clear boundaries without causing blurring.

To achieve the objective above, an aspect of the invention provides a method for eliminating noise in a magnetic resonance image that includes: obtaining a multiple number of magnetic resonance images sequentially within a preset time range for the same part; calculating probability information, which relates to the probability of a first pixel and a second pixel of the multiple magnetic resonance images belonging to the same tissue, by using decay information, which relates to a decay in signal intensity values for the first pixel and the second pixel according to time; and determining a new signal intensity value for the first pixel and the second pixel based on a weighted average of signal intensity values of the first pixel and the second pixel according to the probability information.

In the determining operation, the weights for the first and second pixels can be determined according to the probability of the first pixel and the second pixel belonging to the same tissue.

The weights can be determined based on differences in signal intensity values of the first pixel and the second pixel.

The determining operation can include determining the new signal intensity value for the first and second pixels by calculating a weighted average of signal intensity values of the first pixel and the second pixel for all pixels in each of the multiple magnetic resonance images.

Another aspect of the invention provides a method for eliminating noise in a magnetic resonance image that includes: obtaining a multiple number of magnetic resonance images sequentially within a preset time range for the same part; deciding whether or not a first pixel and a second pixel of the multiple magnetic resonance images belong to the same tissue, by using decay information which relates to a decay in signal intensity values for the first pixel and the second pixel according to time; and determining a new signal intensity value for the first pixel and the second pixel by calculating an average of signal intensity values of the first pixel and the second pixel, if the first pixel and the second pixel belong to the same tissue.

The deciding operation can include deciding that the first and second pixels belong to the same tissue if the difference in signal intensity values of the first pixel and the second pixel is between a first threshold and a second threshold.

The deciding operation can include deciding that the first and second pixels belong to the same tissue if the difference in signal intensity values is larger than the first threshold and smaller than the second threshold.

The first threshold can be selected according to noise level, and the second threshold can be selected empirically.

Still another aspect of the invention provides a method for eliminating noise in a magnetic resonance image that includes: obtaining a multiple number of magnetic resonance images sequentially within a preset time range for the same part; calculating probability information, which relates to a probability of a first pixel and a second pixel of the multiple magnetic resonance images belonging to the same tissue, by using signal intensity change information, which relates to a change in signal intensity values for the first pixel and the second pixel according to relaxation; and determining a new signal intensity value for the first pixel and the second pixel based on a weighted average of signal intensity values of the first pixel and the second pixel according to the probability information.

Yet another aspect of the invention provides a recorded medium, which is readable by a computer, and on which a program of instructions for performing a method above is recorded.

Another aspect of the invention provides an apparatus for eliminating noise in a magnetic resonance image that includes: an MRI acquisition unit configured to obtain a multiple number of magnetic resonance images sequentially within a preset time range for the same part; a decay analysis unit configured to analyze decay information, which relates to a decay in signal intensity values for a first pixel and a second pixel of the multiple magnetic resonance images according to time; a same-tissue decision unit configured to calculate the probability of different pixels belonging to the same tissue by using the analyzed decay information; and a filtering unit configured to determine a new signal intensity value for each of the pixels based on a weighted average of signal intensity values of each of the pixels by using the probability information.

Still another aspect of the invention provides an apparatus for eliminating noise in a magnetic resonance image that includes: an MRI acquisition unit configured to obtain a multiple number of magnetic resonance images sequentially within a preset time range for the same part; a decay analysis unit configured to analyze decay information, which relates to a decay in signal intensity values for a first pixel and a second pixel of the multiple magnetic resonance images according to time; a same-tissue decision unit configured to identify pixels corresponding to the same tissue by using the analyzed decay information; and a filtering unit configured to determine a new signal intensity value for pixels corresponding to the same tissue by calculating an average of the signal intensity values of the pixels.

According to certain embodiments of the invention, the decay information of the signal intensity values of pixels in magnetic resonance images taken sequentially can be used to determine which pixels correspond to the same tissue, and by performing filtering based on this, it is possible to clearly define boundaries while eliminating artificiality.

Additional aspects and advantages of the present invention will be set forth in part in the description which follows, and in part will be obvious from the description, or may be learned by practice of the invention.

DETAILED DESCRIPTION

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals are used for like elements.

Certain embodiments of the invention will be described below in more detail with reference to the accompanying drawings. To aid the overall understanding of the invention, the same reference numerals are used for identical elements regardless of the figure number.

In magnetic resonance imaging, the degree by which the absorbed high-frequency energy is released is different for each tissue. That is, there is a difference in the degree of change in signals (Relaxation, $T_1$ relaxation, $T_2$ relaxation, $T_2^*$ relaxation) for each tissue. An embodiment of the invention applies this to removing noise in magnetic resonance images.

An apparatus for eliminating noise in magnetic resonance images according to an embodiment of the invention can be a computing device that is connected to a magnetic resonance imaging equipment to obtain magnetic resonance images and executes an application for analyzing and processing the images.

Figure 1:
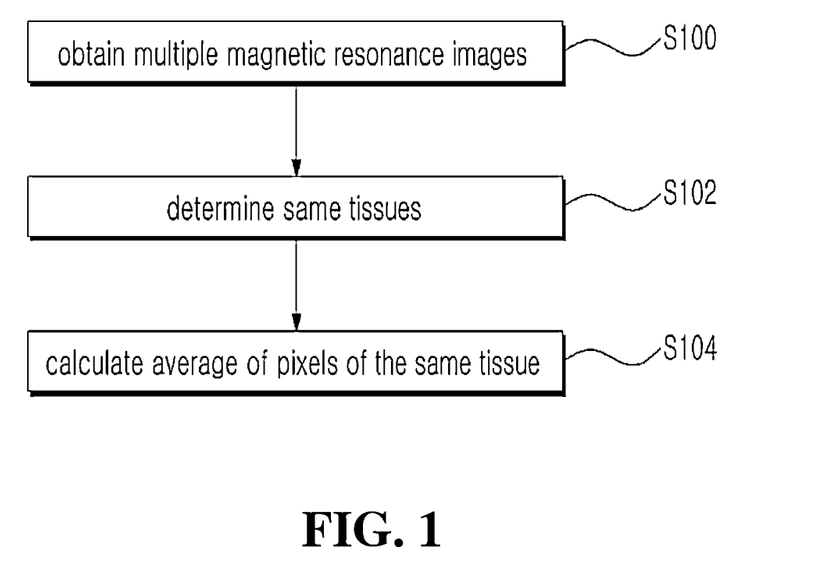
FIG. 1 is a flow diagram of the procedures for eliminating noise according to an embodiment of the invention.

FIG. 1 is a flow diagram of the procedures for eliminating noise according to an embodiment of the invention.

Referring to FIG. 1, an apparatus for eliminating noise according to an embodiment of the invention may obtain magnetic resonance images sequentially within a preset time range for the same part (operation 100).

A hydrogen nucleus, composed of a proton and a neutron, has a spin and a magnetic moment and can thus be regarded as a tiny magnet. When high-frequency waves are generated in the presence of a magnetic field, certain hydrogen nuclei in lower states are moved to high-energy states, and the mean magnetization is placed in a horizontal direction in an X-Y plane.

Afterwards, when the high-frequency pulses are removed, the hydrogen nuclei in high energy states re-emit the high-frequency energy that had been absorbed and return to their original states. This phenomenon is referred to as relaxation.

Relaxation times include $T_1$ relaxation, $T_2$ relaxation, $T_{1\rho}$ relaxation and $T_2^*$ relaxation. The present invention can be applied to all types of relaxation times.

Each tissue has a unique value for a relaxation time, and when the magnitude of the magnetic field is constant, the relaxation time at each tissue is constant.

There are various types of relaxation time. $T_1$ relaxation time is defined as the time until a mean magnetization amounting to 63% of the initial state in the Z direction is reached, and $T_2$ relaxation time is defined as the time until a mean magnetization of the X-Y plane is reduced to 37% of the initial value by dephasing.

$T_2^*$ relaxation time is defined as the relaxation time resulting from changes in the magnetic field and molecular interactions ($T_2$ molecular effect) which are causes that reduce transverse magnetization.

Figure 2:
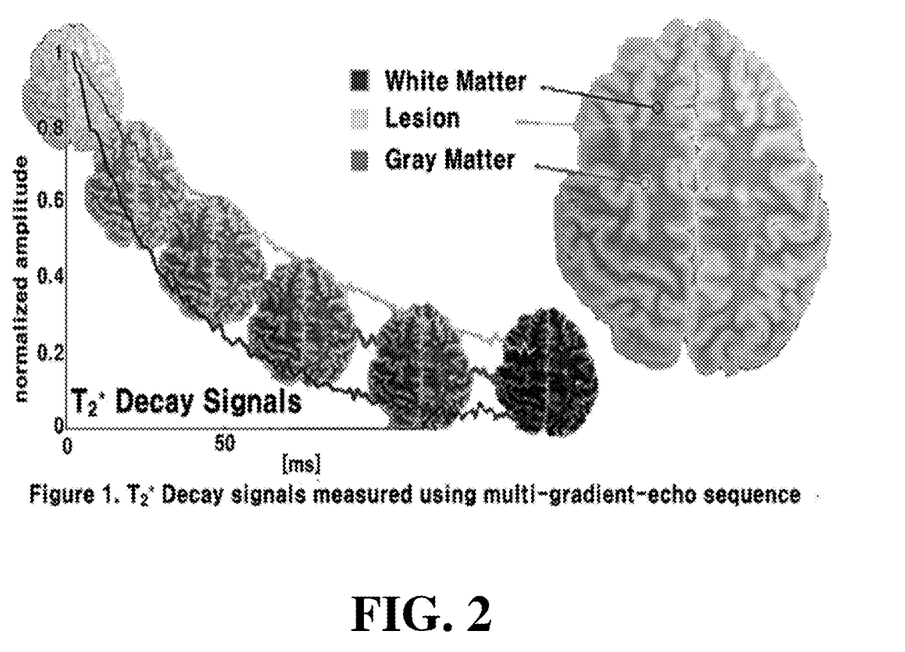
FIG. 2 illustrates a $T_2^*$ relaxation state in magnetic resonance images of a brain.

FIG. 2 illustrates a $T_2^*$ relaxation state in magnetic resonance images of a brain.

Each type of relaxation time described above represents a particular period during which hydrogen nuclei that have absorbed high-frequency energy release the energy to return to their original states.

Figure 3:
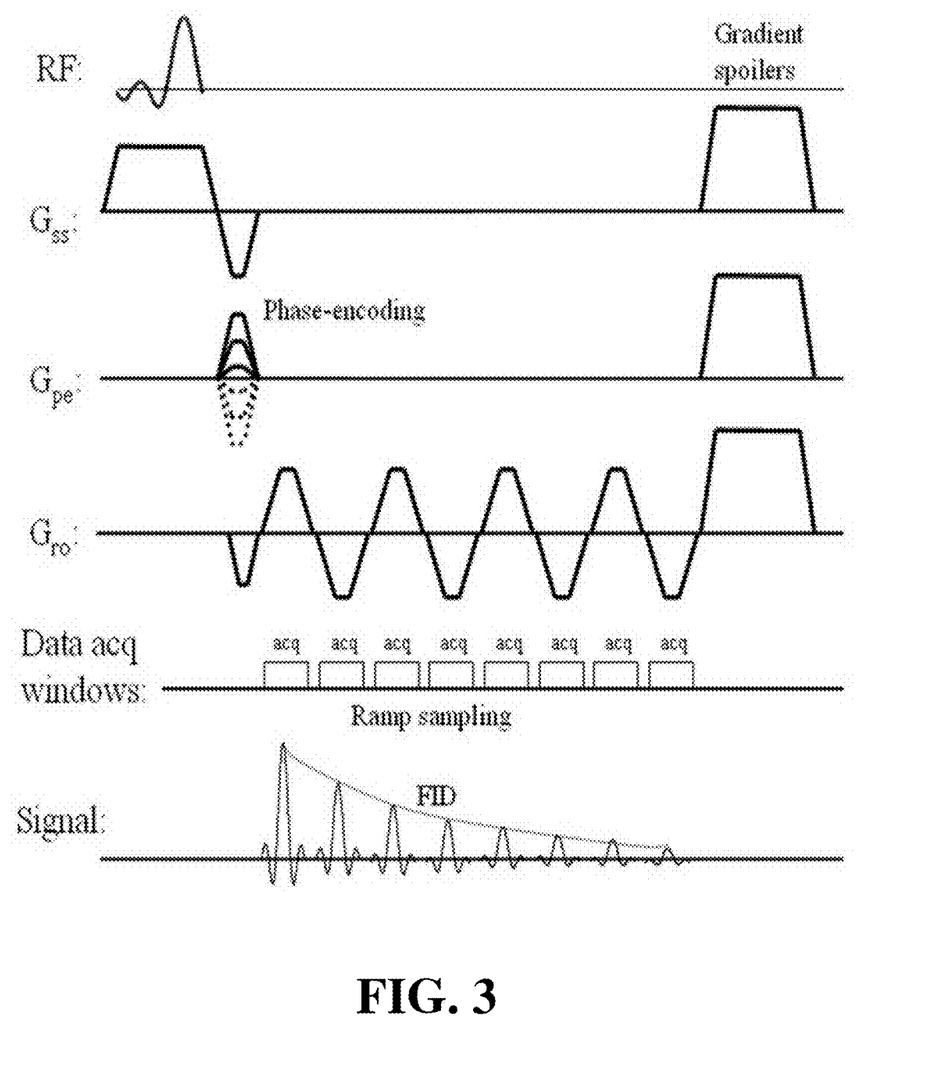
FIG. 3 illustrates an example of signal timing for obtaining multiple magnetic resonance images.

As illustrated in FIG. 3, an embodiment of the invention may entail obtaining a multiple number of magnetic resonance images sequentially within a particular period (a preset amount of time) of relaxation time. In FIG. 3, the sequential acquisition of the multiple magnetic resonance images is indicated by "Data acq windows".

In FIG. 3, Gss represents the slice selection gradient, Gpe represents the phase encoding gradient, and Gss represents the gradient amplitude.

Of course, those skilled in the art would appreciate that FIG. 3 merely illustrates one example of obtaining magnetic resonance images and that other schemes for signal timing are also possible.

Here, the multiple number of magnetic resonance images can be defined as multi-echo MR images.

Relaxation, as described above, involves a gradual change in the information of the absorbed energy being released. When multiple magnetic resonance images are obtained, the same pixels in the magnetic resonance images obtained at different times would follow different trends according to the tissue, and an embodiment of the invention may take advantage of this fact and apply it to noise elimination.

To be more specific, in the case of $T_2$ relaxation and $T_2^*$ relaxation, decaying of the signals occurs with time. Thus, it is possible to perform filtering by using the decay information of signal intensity values of pixels to determine the probability of such pixels belonging to the same tissue.

In the case of $T_1$ relaxation, however, there may not necessarily be a decaying of signals according to the passage of time. Thus, the filtering may be performed by using changes in signal intensity values of pixels resulting from the relaxation in the observed part, after the generating of the high-frequency pulses, to determine the probability of different pixels belonging to the same tissue.

For convenience, the following descriptions of procedures for noise elimination will focus on $T_2$ relaxation and $T_2^*$ relaxation, which entails signal decay. However, those skilled in the art would understand that the present invention is not limited thereto.

Referring again to FIG. 1, an apparatus for eliminating noise according to an embodiment of the invention may decide whether or not different pixels correspond to the same tissue (operation 102) by using the decay information of each of the pixels (i.e. the degree of decay of the signal intensity values of the pixels resulting from relaxation) in the multiple magnetic resonance images.

Operation 102 may entail analyzing the signal intensity values of a first pixel and the signal intensity values of a second pixel in the magnetic resonance images obtained at different times, obtaining signal decay information, and deciding whether or not the first pixel and the second pixel belong to the same tissue based on the decay information.

If the degrees of decay for the signal intensity values of the first pixel and second pixel are similar, then it can be decided that these pixels belong to the same tissue.

To be more specific, it may be decided that a first pixel and a second pixel in a magnetic resonance image belong to the same tissue if the difference between the signal intensity values of the first pixel and second pixel are within a preset range, as shown by Equation 1 below.

$$n(TE||S_1(TE)-S_2(TE)|\geq \text{threshold1})\leq \text{threshold2} \quad \text{[Equation 1]}$$

Here, $S_1(TE)$ and $S_2(TE)$ refer to the signal intensity values of a first pixel and a second pixel, respectively, in a magnetic resonance image obtained at a particular time (echo time, TE). If the difference between the two signal intensity values is greater than or equal to a preset first threshold, and if the number of cases that satisfy this condition is smaller than or equal to a second threshold, then it may be decided that the two pixels belong to the same tissue.

Of course, Equation 1 written above is merely an example, and the decision of whether or not certain pixels belong to the same tissue can also be made by applying other equations.

Here, the first threshold can be selected based on noise level, and the second threshold can be selected empirically.

Figure 4:
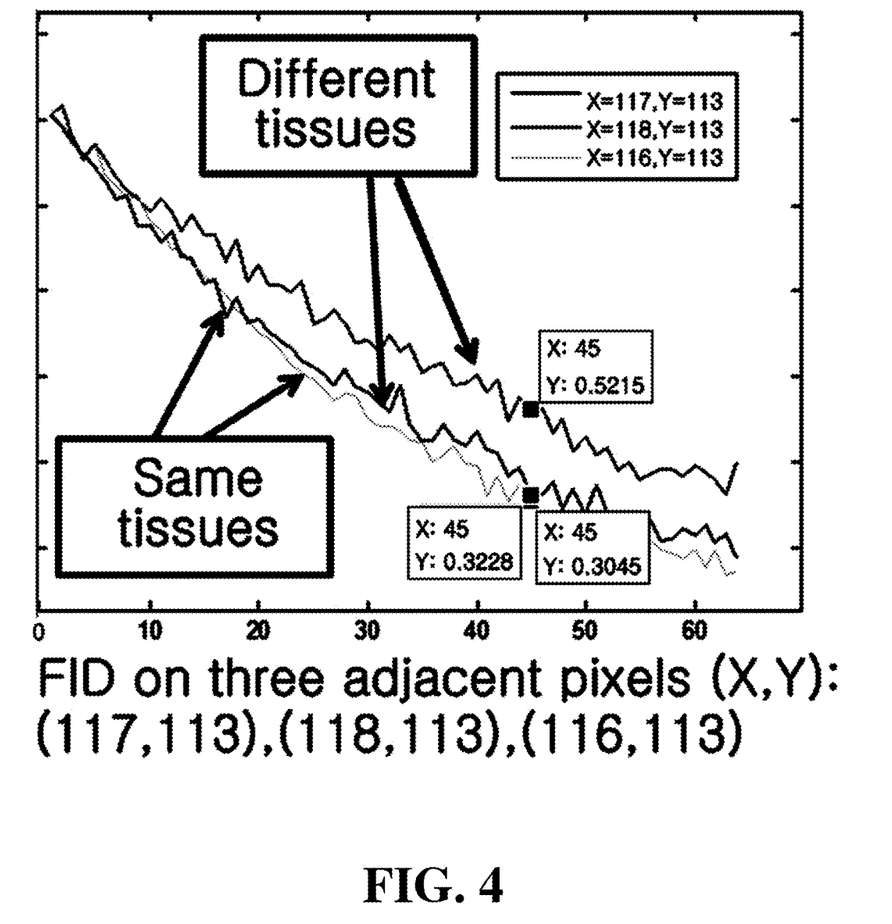
FIG. 4 illustrates decay signals in pixels that are adjacent to each other.

FIG. 4 illustrates decay signals in pixels that are adjacent to each other.

As illustrated in FIG. 4, the signal intensity values of each of the pixels in the obtained magnetic resonance images may decay with the passage of time, following a unique trend. As the pixels at (116,113) and (118,113) follow similar trends, it can be decided that these belong to the same tissue, and as these differ from the pixel at (117,113) by a degree that exceeds the threshold range, it can be decided that these pixels belong to different tissues.

In an embodiment of the invention, operation 102 can entail calculating the probability of belonging to the same tissue for different pixels, in which case the calculating of the probability that two pixels belong to the same tissue can be performed by using Equation 2 shown below.

$$D(r,s) = \frac{|S(r)-S(s)|}{h(r)} \frac{1}{=} \sum_{n=1}^{N} \frac{|S(r,t_n)-S(s,t_n)|}{h(r)} \quad \text{[Equation 2]}$$

where r, s: positions of pixels (expressed as vectors)
S(r): signal at position r
$t_n$: time ($t_1$, $t_2$, $t_3$, . . . , $t_n$)
$S(r,t_n)$: signal at time $t_n$ and position r
h(r): compensating factor for the affect of noise (applied at position r)
D(r,s): degree of difference between the tissue corresponding to position r and the tissue corresponding to position s.

By operation 102, pixels in the magnetic resonance images can be classified into pixels that have been determined as belonging to the same tissue and pixels that have been determined as belonging to different tissues.

According to an embodiment of the invention, filtering may be performed by calculating an average signal intensity value for pixels that are determined as belonging to the same tissue (operation 104).

For example, if it is decided, through an analysis of signal decay information in the multiple magnetic resonance images, that a first pixel and a second pixel belong to the same tissue, an apparatus according to an embodiment of the invention may calculate an average of the signal intensity value of the first pixel and the signal intensity value of the second pixel to determine a new signal intensity value for these pixels.

That is, based on an average of the signal intensity values of the first pixel and second pixel, the signal intensity values of these pixels may be renewed.

Operation 104 can entail calculating an average by applying different weights on the signal intensity values of the first pixel and second pixel.

Operation 104 can include calculating the weights as in Equation 3 below, by using the probability information calculated in operation 102, and performing filtering by obtaining a weighted average as in Equation 4.

$$w_\rho(r, s) = \frac{1}{\zeta_r} e^{-D(r,s)} \text{ for } s \in B_\rho(r) \qquad \text{[Equation 3]}$$

Here, w(r,s) is a weight used for the weighted average for filtering. The weights may be determined depending on the degree of difference between the two pixels, i.e. the value of D(r,s). That is, the greater the difference D(r,s), the smaller the value of w(r,s), and hence the smaller its influence during the weighted averaging. The smaller the difference D(r,s), the greater the value of w(r,s), and hence the greater its influence during the weighted averaging. In other words, a small D(r,s) means that there is a high likelihood that r and s belong to the same tissue (a high probability of belonging to the same tissue), and as such, its influence in the weighted average may be increased. The denominator $\zeta_r$ is a normalized constant.

With the weights determined as above, a weighted average can be obtained according to Equation 4.

$$S_{NL}(r, t_n) = \sum_{s \in B_\rho(r)} w_\rho(r, s) S(s, t_n) \qquad \text{[Equation 4]}$$

$S_{NL}$: pixel value after the filtering (at position r, time $t_n$)

The summation on the right represents the weighted average, w represents a weight, $S(s,t_n)$ represents a signal value at position s and $t_n$, and B represents a surrounding area of position r (i.e. filtering is performed only within this area). B can be an area surrounding the position r, and this area can be extended to an entire image.

Here, the weights can be determined according to the probability of the pixels belonging to the same tissue. For example, if the difference in signal intensity values between a first pixel and a second pixel is small, whereas the difference in signal intensity values between the first and second pixels and a third pixel is large, then a smaller weight can be assigned for the third pixel compared to the weights of the first and second pixels. That is, if the probability of the first pixel and the second pixel belonging to the same tissue is greater than the probability of the first pixel and the third pixel belonging to the same tissue, then higher weights can be applied to the first pixel and second pixel.

Operation 104 may be performed for all pixels in a magnetic resonance image, and may also be performed for all of the multiple magnetic resonance images.

Figure 5:
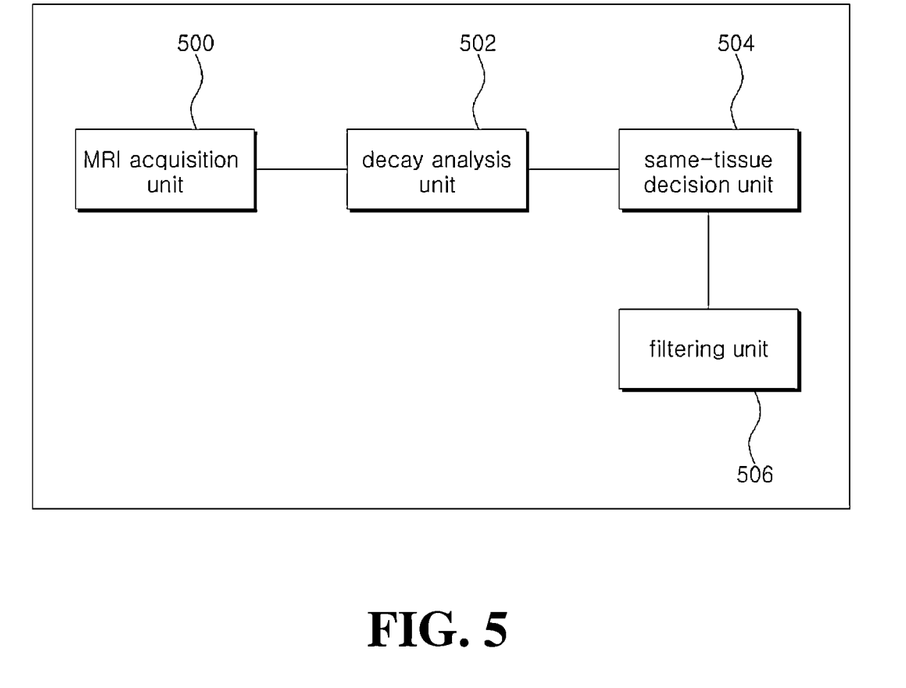
FIG. 5 is a block diagram of an apparatus for eliminating noise according to an embodiment of the invention.

FIG. 5 is a block diagram illustrating the composition of an apparatus for eliminating noise in magnetic resonance images according to an embodiment of the invention.

As illustrated in FIG. 5, an apparatus for eliminating noise in magnetic resonance images according to an embodiment of the invention can include an MRI acquisition unit 500, a decay analysis unit 502, a same-tissue decision unit 504, and a filtering unit 506.

The MRI acquisition unit 500 may obtain a multiple number of magnetic resonance images sequentially within a preset time range during which relaxation occurs after the emission of high-frequency waves.

The decay analysis unit 502 may analyze the decay information, which relates to the decay according to time of the signal intensity values for each pixel of the multiple magnetic resonance images.

Preferably, the decay analysis unit 502 can analyze the decay information for adjacent pixels.

The same-tissue decision unit 504 may determine which pixels correspond to the same tissues in the magnetic resonance images.

As in FIG. 4, the same-tissue decision unit 504 can decide that pixels having similar trends in terms of the decay of signals belong to the same tissue.

Here, the procedure for deciding whether or not certain pixels belong to the same tissue can include calculating the probability of belonging to the same tissue and determining whether or not they belong to the same tissue based on the probability.

The filtering unit 506 may calculate an average of signal intensity values of pixels corresponding to the same tissue to renew the signal intensity values of the pixels.

If the probability information relating to the probability of different pixels belonging to the same tissue is calculated as described above, then the filtering unit 506 can calculate a weighted average to renew the signal intensity values.

According to an embodiment of the invention, the filtering, i.e. noise elimination, may be performed after deciding whether or not the pixels belong to the same tissue, so that the images can be obtained with clear boundaries and with artificiality removed.

Figure 6:
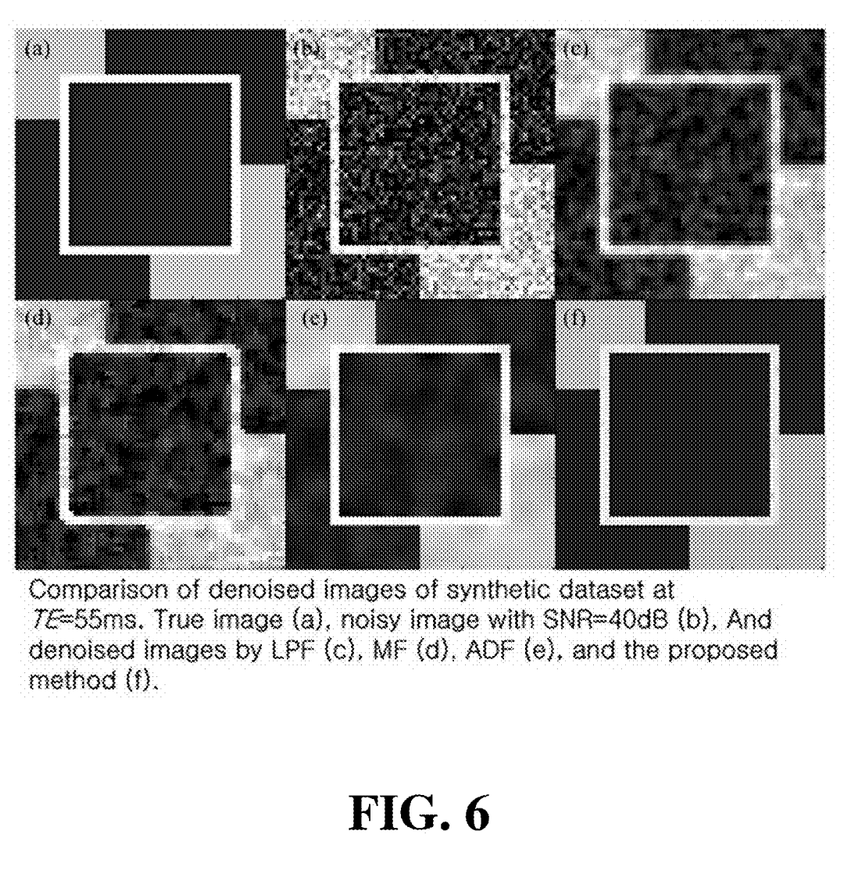
FIG. 6 show images with noise removed according to an embodiment of the invention and according to conventional techniques.

FIG. 6 show images with noise removed according to an embodiment of the invention and according to conventional techniques.

In FIG. 6, a synthetic (simulated) multi-echo image dataset was used for comparison with other methods. The synthetic image data includes three types of tissues: white matter (WM), lesion, and gray matter (GM).

In FIG. 6 (TE=64 ms, total echo time), the three dark grey areas correspond to white matter, the two brighter areas correspond to grey matter, and the thin white areas correspond to lesions.

The size of the synthetic image data is 60×60, the number of echoes (number of magnetic resonance images obtained) is 64, TE1=1 ms, and ES=1 ms.

At different echo times (MRI acquisition times), the signal intensities (decay information) of the white matter, lesions, and grey matter may be obtained by the equation shown below.

$$S_{WM}(TE) = 0.1 \times e^{-TE/10} + 0.5 \times e^{-TE/80} + 0.4 \times e^{-TE/100} \qquad \text{[Equation 5]}$$

$$S_{lesion}(TE) = 0.55 \times e^{-TE/80} + 0.45 \times e^{-TE/100} \qquad \text{[Equation 6]}$$

$$S_{GM}(TE) = 0.02 \times e^{-TE/10} + 0.48 \times e^{-TE/80} + 0.4 \times e^{-TE/100} \qquad \text{[Equation 7]}$$

Gaussian random noise was added to all signals, where the SNR at the initial echo time was 40 dB.

Afterwards, filtering was performed according to the respective method.

In comparison with the original image shown in (a) and the image containing noise shown in (b) of FIG. 6, it can be seen that the case of applying a LPF results in severe blurring. While the cases of applying a MF (median filter) and an ADF (anisotropic diffusion filter) provide less blurring, the feel of artificiality is not removed.

However, in (f) of FIG. 6, it can be seen that a method based on an embodiment of the invention can be applied to provide clear boundaries and remove artificiality.

Figure 7:
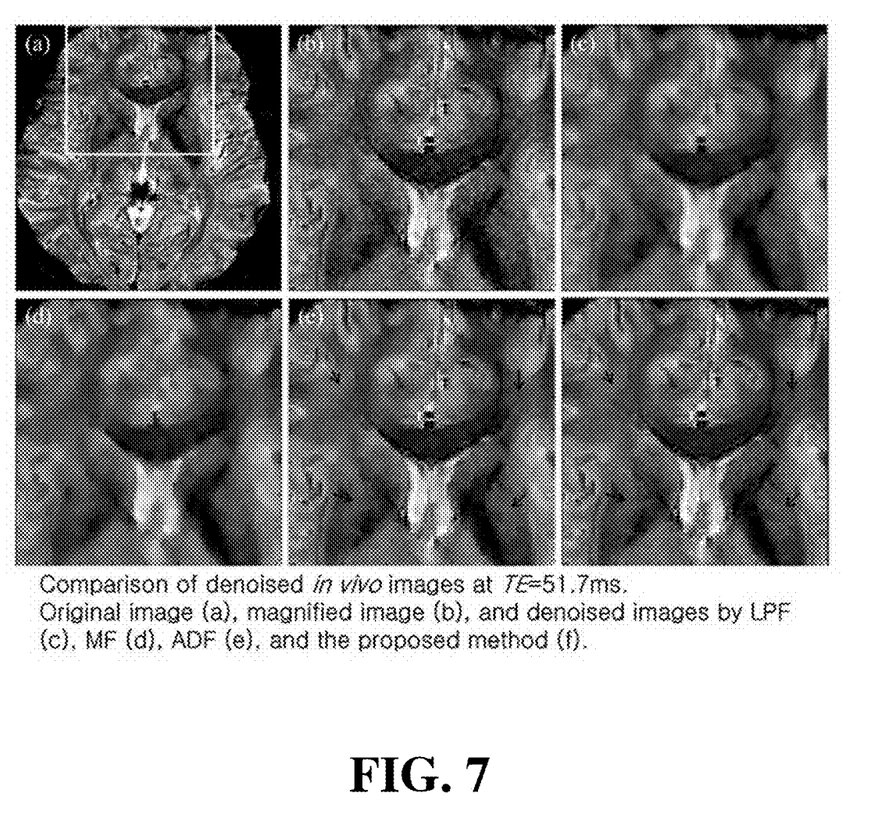
FIG. 7 and FIG. 8 show magnetic resonance images of an actual brain with noise removed.
Figure 8:
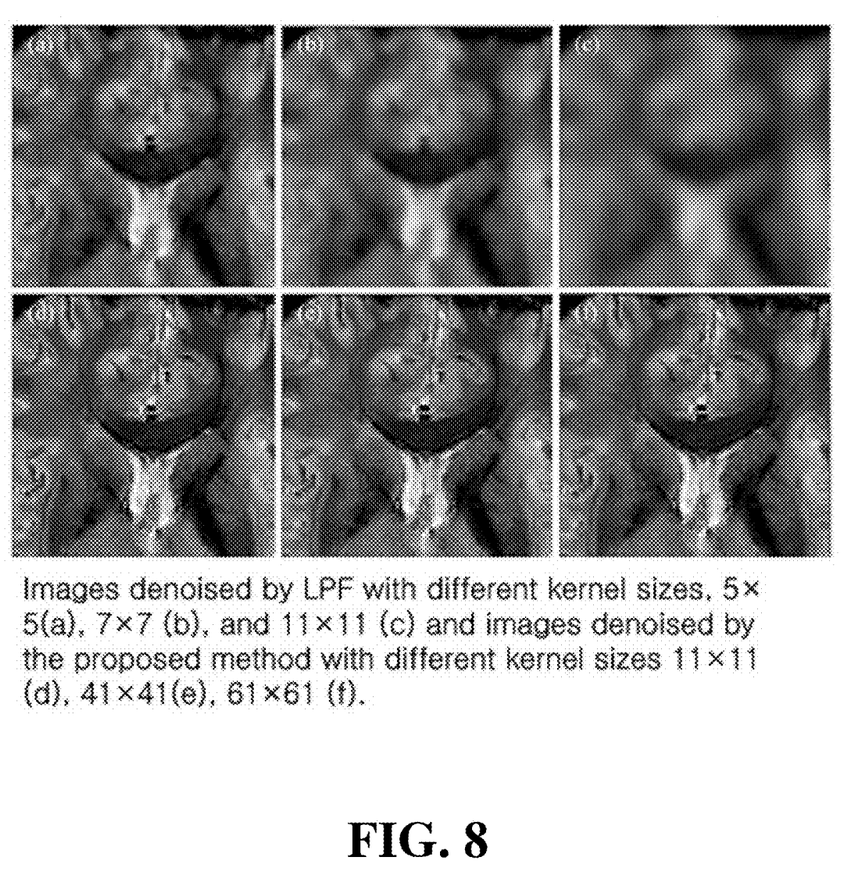

FIG. 7 and FIG. 8 show magnetic resonance images of an actual brain, and in FIG. 7 and FIG. 8, it can be seen that applying a method of eliminating noise according to an embodiment of the invention can eliminate noise with greater reliability compared to other methods.

Also, as shown in FIG. 8, applying a method based on an embodiment of the invention may prevent the occurrence of blurring, even with an increased kernel size during filtering.

The embodiments of the present invention can be implemented in the form of program instructions that may be performed using various computer means and can be recorded in a computer-readable medium. Such a computer-readable medium can include program instructions, data files, data structures, etc., alone or in combination. The program instructions recorded on the medium can be designed and configured specifically for the present invention or can be a type of medium known to and used by the skilled person in the field of computer software. Examples of a computer-readable medium may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, etc. Examples of the program of instructions may include not only machine language codes produced by a compiler but also high-level language codes that can be executed by a computer through the use of an interpreter, etc. The hardware mentioned above can be made to operate as one or more software modules that perform the actions of the embodiments of the invention, and vice versa.

The preferred embodiments of the present invention described above are disclosed for illustrative purposes, and various modifications, alterations, and additions can be made by a person having ordinary skill in the technical field to which the present invention pertains, without departing from the spirit and scope of the invention. Such modifications, alterations, and additions are to be regarded as being encompassed by the scope of claims set forth below.

What is claimed is:

1. A computer-implemented method for converting a magnetic resonance image to a noise-reduced image, the method comprising:
    producing, using a magnetic resonance imaging machine, a plurality of magnetic resonance images sequentially within a preset time range for a same part;
    generating, by a computing device connected to the magnetic resonance imaging machine:
        i) decay information indicating a decay in signal intensity values for a first pixel and a second pixel of the plurality of magnetic resonance images according to time,
        ii) probability information indicating a probability of the first pixel and the second pixel belonging to a same tissue, by using the decay information to determine a similarity in degree of the decay in the signal intensity values for the first pixel and the second pixel, and
        iii) weights for the first pixel and the second pixel according to the probability of the first pixel and the second pixel belonging to the same tissue;
    calculating, by the computing device on a pixel-by-pixel basis, a weighted average of signal intensity values of the first pixel and the second pixel for all pixels in each of the plurality of magnetic resonance images, according to the probability information, to produce a new signal intensity value for the first pixel and the second pixel; and
    converting, by the computing device, one or more of the plurality of magnetic resonance images to one or more noise-reduced images based on the new signal intensity value.

2. The method of claim 1, wherein the weights are determined based on differences in signal intensity values of the first pixel and the second pixel.

3. A computer-implemented apparatus for converting a magnetic resonance image to a noise-reduced image, the apparatus comprising:
    an MRI acquisition unit configured to produce a plurality of magnetic resonance images sequentially within a preset time range for a same part; and
    a computing device connected to the MRI acquisition unit and configured to:
        a) generate i) decay information indicating a decay in signal intensity values for a first pixel and a second pixel of the plurality of magnetic resonance images according to time, ii) probability information indicating a probability of the first pixel and the second pixel belonging to a same tissue, by using the decay information to determine a similarity in degree of the decay in the signal intensity values for the first pixel and the second pixel, and iii) weights for the first pixel and the second pixel according to the probability of the first pixel and the second pixel belonging to the same tissue,
        b) calculate, on a pixel-by-pixel basis, a weighted average of signal intensity values of the first pixel and the second pixel for all pixels in each of the plurality of magnetic resonance images, according to the probability information, to produce a new signal intensity value for the first pixel and the second pixel, and
        c) convert one or more of the plurality of magnetic resonance images to one or more noise-reduced images based on the new signal intensity value.

4. The apparatus of claim 3, wherein the MRI acquisition unit obtains the plurality of magnetic resonance images in preset time intervals.

* * * * *